United States Patent [19]

Watanabe

[11] Patent Number: 5,365,106
[45] Date of Patent: Nov. 15, 1994

[54] RESIN MOLD SEMICONDUCTOR DEVICE

[75] Inventor: Toshiya Watanabe, Tokyo, Japan

[73] Assignee: Kabushiki Kaisha Toshiba, Kawasaki, Japan

[21] Appl. No.: 127,060

[22] Filed: Sep. 27, 1993

[30] Foreign Application Priority Data

Oct. 27, 1992 [JP] Japan ................................. 4-288561

[51] Int. Cl.$^5$ ............................................. H01L 23/48
[52] U.S. Cl. .................................... 257/669; 257/676;
257/730
[58] Field of Search .......................... 257/669, 676, 730

[56] References Cited

U.S. PATENT DOCUMENTS

| | | | |
|---|---|---|---|
| 5,173,764 | 12/1992 | Higgins, III | 257/669 |
| 5,223,739 | 6/1993 | Katsumata et al. | 257/676 |
| 5,252,783 | 10/1993 | Baird | 257/676 |

FOREIGN PATENT DOCUMENTS 4-164355  6/1992  Japan .

*Primary Examiner*—Rolf Hille
*Assistant Examiner*—Roy Potter
*Attorney, Agent, or Firm*—Finnegan, Henderson, Farabow, Garrett & Dunner

[57] ABSTRACT

A first lead frame A has an island 21 on which a semiconductor chip 24 is mounted. The major surface of the island that is opposite to the major surface on which the semiconductor chip 24 is mounted is exposed to the outside of a resin member. A second lead frame B includes a distortion preventing member 26 having substantially the same shape as the island 21 of the first lead frame A. The major surface of the distortion preventing member 26 that is opposite to the major surface facing the island 21 is exposed to the outside of the resin member. The semiconductor chip 24 is located between the island 21 and the distortion preventing member 26. Thus, the semiconductor device has low thermal resistance, and its final shape has no distortion.

4 Claims, 3 Drawing Sheets

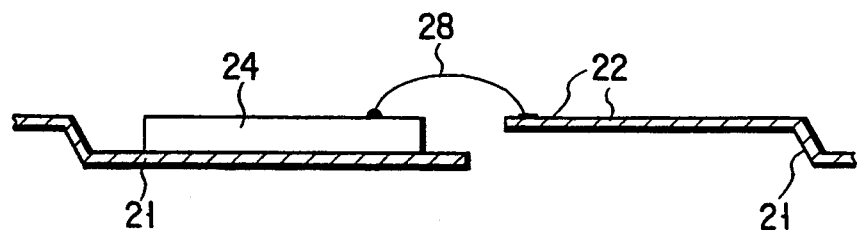
F I G. 4
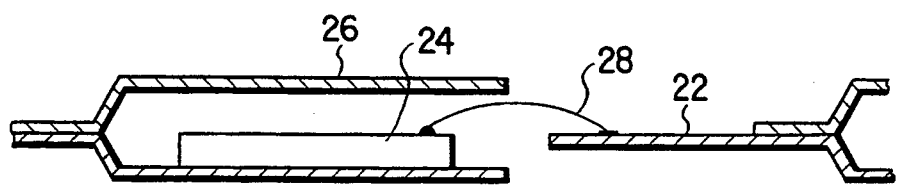
F I G. 5
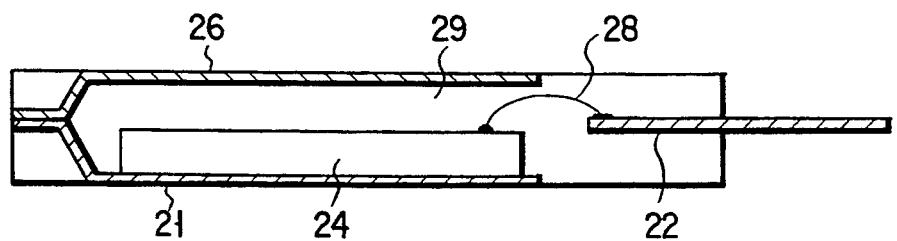
F I G. 6

RESIN MOLD SEMICONDUCTOR DEVICE

BACKGROUND OF THE INVENTION

1. Field of the Invention

The present invention relates to an improvement of a resin mold semiconductor device wherein one major surface of an island (i.e., a die pad) of a lead frame is exposed to the outside of a resin member, for realizing low thermal resistance.

2. Description of the Related Art

To reduce thermal resistance, a conventional resin mold semiconductor device adopts a structure wherein one major surface of an island 11a (i.e., a die pad) of a lead frame 11 is exposed to the outside of a resin member 12, as is shown in FIG. 1.

However, the resin mold semiconductor device of this structure has problems in that its final shape is likely to be distorted due to the heat treatment performed for forming the resin member 12. The distortion of the final shape is attributed to the fact that two materials having different coefficients of thermal expansion are bonded together, as in a bimetal. To be specific, the lead frame 11 (metal) and the resin member are formed of materials having different coefficients of thermal expansion.

If the final shape of the resin mold semiconductor device is distorted, it is likely that a semiconductor chip 13 sealed within the resin member 12 will have defects, such as cracks.

As described above, the conventional resin mold semiconductor device has its thermal resistance lowered, with one major surface of the island of the lead frame being exposed to the outside of the resin member, but the resin mold semiconductor device has problems in that its final shape is likely to be distorted due to the heat treatment performed for forming the resin member.

SUMMARY OF THE INVENTION

The present invention has been developed in an effort to solve the problem mentioned above, and an object of the invention is to provide a resin mold semiconductor device which has low thermal resistance and the final shape of which has no distortion.

To achieve this object, the resin mold semiconductor device of the present invention comprises: a first lead frame which includes an island for permitting a semiconductor chip to be thereon and which is structured such that one major surface of the island opposite to the major surface on which the semiconductor is mounted is exposed to the outside of a resin member; and a second lead frame which includes a distortion preventing member having substantially the same shape as the island of the first lead frame and which is structured such that one major surface of the distortion preventing member opposite to the major surface facing the island is exposed to the outside of the resin member.

The first lead frame have inner leads and outer leads, and the first and second lead frames has positioning holes used when the lead frames are put one upon the other.

In the resin mold semiconductor device of the present invention, the second lead frame includes a distortion preventing member having substantially the same shape as the island of the first lead frame and is structured such that one major surface of the island opposite to the major surface on which the semiconductor is mounted is exposed to the outside of the resin member. At the time of resin sealing, the stress due to the thermal expansion is balanced between the two surfaces of the resin member. Thus, the final shape of the resin mold semiconductor device has no distortion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 4 to 6 are cross sectional views showing how the resin mold semiconductor device depicted in FIG. 3 is manufactured.

DETAILED DESCRIPTION OF THE PREFERRED EMBODIMENTS

One embodiment of the present invention will now be described with reference to FIGS. 3-6 of the accompanying drawings.

Figure 1:
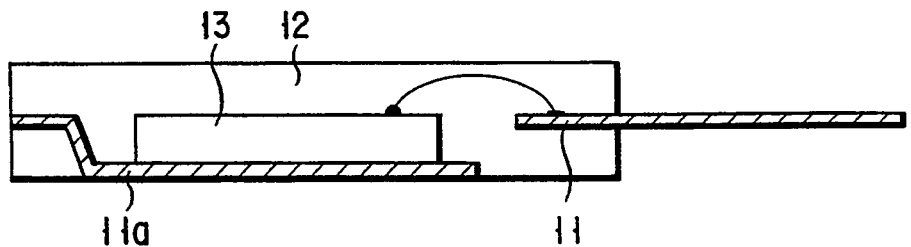
FIGS. 1 to 2 are cross sectional views showing a conventional resin mold semiconductor device.
Figure 2:
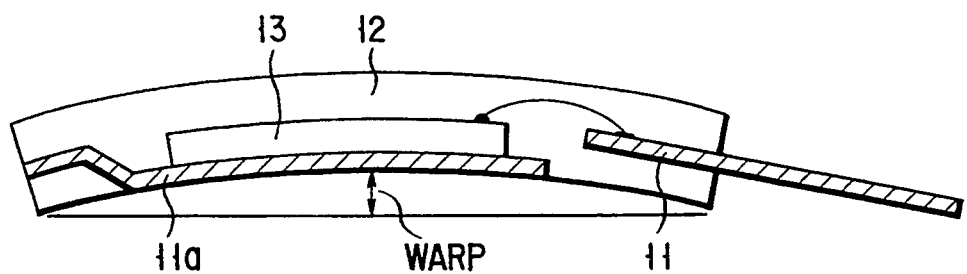
Figure 3:
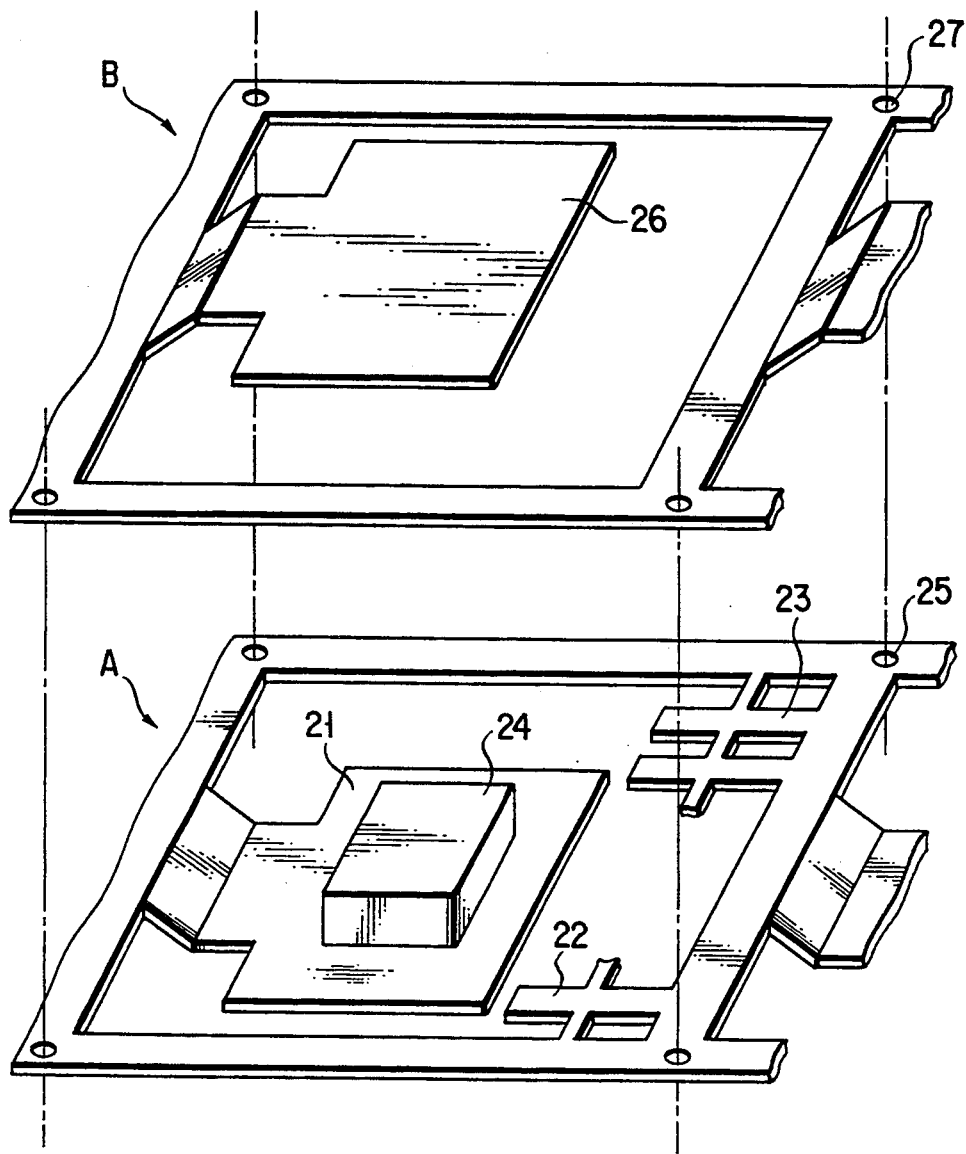
FIG. 3 is a perspective view showing a resin mold semiconductor device according to one embodiment of the present invention.

FIG. 3 shows a resin mold semiconductor device according to one embodiment of the present invention. Referring to FIG. 3, "A" denotes a first lead frame, and "B" denotes a second lead frame. The first lead frame A comprises an island (i.e., a die pad) 21, inner leads 22, outer leads 23, and positioning holes 25. A semiconductor chip 24 is mounted on the island 21 of the first lead frame A. The second lead frame B comprises distortion preventing member 26, and positioning holes 27.

The resin mold semiconductor device of the embodiment is featured in that it comprises the second lead frame B in addition to the first lead frame A (which is substantially similar to a conventional lead frame). The distortion preventing member 26 of the second lead frame B has substantially the same shape as the island 21 of the first lead frame A. Normally, the island 21 and the distortion preventing member 26 are in the form of square flat plates. Like the island 21, the distortion preventing member 26 has one major surface exposed to the outside of a resin member.

In the resin mold semiconductor device of the embodiment, metal portions, namely one major surface of the island 21 of the first lead frame A and one major surface of the distortion preventing member 26 of the second lead frame B, are exposed to the outside of the resin member. With this structure, the stress due to the thermal expansion is balanced between the two surfaces of the resin member, thereby preventing the final shape of the device from being distorted.

The island 21 of the first lead frame A and the distortion preventing member 26 of the second lead frame B have to be arranged symmetric to each other. For this arrangement, the positioning holes 25 and 27 are formed at predetermined positions of the first and second lead frames A and B. When the resin member is formed, molded pins are inserted into the positioning holes 25 and 27.

A method for manufacturing the resin mold semiconductor device shown in FIG. 3 will be described, with reference to FIGS. 4 and 6.

As is shown in FIG. 4, the semiconductor chip 24 is first mounted on the island 21 of the first lead frame (e.g., a copper alloy an iron alloy) A, and is then connected to an inner lead 22 by wire bonding 28.

Next, the second lead frame (e.g., a copper alloy, an iron alloy) B is put on the first lead frame A, as is shown in FIG. 5. This can be easily performed, for example, by installing the first lead frame A in a resin member-forming die and subsequently installing the second lead frame B with reference to the first lead frame A.

Then, resin sealing (i.e., the formation of the resin member) is performed, as is shown in FIG. 6. Since the first and second lead frame members A and B are formed of the same material, thermal expansion occurs similarly between the two opposing surfaces of the resin member 29 at the time of heat treatment. Therefore, the stress due to the thermal expansion is balanced between the two surfaces of the resin member, thereby preventing the final shape of the device from being distorted.

Finally, the resin mold semiconductor device having the final shape is cut off from the first and second lead frames A and B by using a known method.

In the conventional art, one major surface of an island of a lead frame is exposed to the outside only in one surface of a resin member. Thus, the package is likely to be distorted, due to the bimetallic structure made up of the lead frame and the resin member. In the present invention, in contrast, first and second lead frames formed of the same metallic material are employed, and the second lead frame is provided with a distortion preventing member having a similar shape to that of the island of the first lead frame. In the resin mold semiconductor device having the final shape, the resin member is sandwiched between two metal plates, one being the island of the first lead frame and the other being the distortion preventing member of the second lead frame. With this structure, the stress is well balanced between the two surfaces of the resin member, low thermal resistance is realized, and the final shape of the semiconductor device has no distortion.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A resin mold semiconductor device comprising:

a first lead frame including an island and at least one lead, said island having a first major surface on which a semiconductor chip is mounted, and a second major surface opposite to the first major surface and exposed at an outside surface of a resin member, each lead being located in an area adjacent to the island; and a second lead frame including a distortion preventing member having a substantially similar shape to that of the island of the first lead frame, said distortion preventing member having a first major surface facing the first major surface of the island of the first lead frame and a second major surface exposed at an opposite outside surface of the resin member, the second lead frame further including a gap along an edge of the distortion preventing member that corresponds to the area in which each lead is located when the second lead frame is positioned proximate to the first lead frame.

2. A resin mold semiconductor device according to claim 1, wherein the at least one lead of said first lead frame includes a plurality of inner leads and outer leads.

3. A resin mold semiconductor device according to claim 1, wherein each of said island and said distortion preventing member is a square flat plate.

4. A resin mold semiconductor device according to claim 1, wherein each of said first and second lead frames has a positioning hole for attaching the first and second lead frames together when the first and second lead frames are positioned proximate to each other.

* * * * *